United States Patent [19]

Newton

[11] 4,407,883

[45] Oct. 4, 1983

[54] LAMINATES FOR PRINTED CIRCUIT BOARDS

[75] Inventor: Thomas D. Newton, Onalaska, Wis.

[73] Assignee: UOP Inc., Des Plaines, Ill.

[21] Appl. No.: 354,311

[22] Filed: Mar. 3, 1982

[51] Int. Cl.$^3$ .............................................. B32B 27/34
[52] U.S. Cl. .................................... 428/215; 428/415; 428/416; 428/417; 428/436; 428/458; 428/460; 428/473.5; 428/901; 428/273; 156/307.3; 156/330
[58] Field of Search ............... 428/215, 334, 415, 416, 428/417, 460, 458, 436, 473.5, 901

[56] References Cited

U.S. PATENT DOCUMENTS 3,958,317  5/1976  Peart et al. .................... 428/473.5 X
3,985,928 10/1976  Watanabe et al. ............ 428/473.5 X
4,104,438  8/1978  Angelo et al. ................ 428/473.5 X Primary Examiner—P. Ives
Attorney, Agent, or Firm—James R. Hoatson, Jr.; Raymond H. Nelson; William H. Page

[57] ABSTRACT

Laminates for printed circuit boards may comprise a metal-covered, relatively thin high temperature-resistant barrier material bonded to at least one side of a core material, the temperature resistance of the barrier layer being greater than that of the core. An example of the laminate will comprise a core material comprising an epoxy/glass laminate to which is bonded on both sides a barrier layer comprising a polyimide resin, said polyimide resin having a copper foil on the outer surface thereof. The laminates may be prepared by laying up a metal-clad high temperature-resistant barrier which has been fully cured on the core material followed by lamination of the composite at a temperature in the range of from about 150° F. to about 450° F. and a pressure in the range of from about 100 to about 1200 psi.

1 Claim, No Drawings

LAMINATES FOR PRINTED CIRCUIT BOARDS

BACKGROUND OF THE INVENTION

Printed circuit boards which comprise a conductive metal coating or foil on one or both sides of a non-conductive material such as a resin (reinforced or otherwise) are utilized in the electrical and electronic industries to a great extent. The metal coating which may be relatively thin in nature is etched in a predetermined pattern so as to provide a flow of electricity between two or more points. With the advent of more sophisticated equipment, printed circuit boards have become increasingly important in the industry. The printed circuit boards which are now in use comprise a wide variety of systems. When using certain resins as the basis for the laminate materials on which the conductive metal is mounted, certain disadvantages crop up from time to time. This is particularly true when conventional means of etching, soldering, drilling, etc. are employed to prepare the desired board. For example, surface mounting components on printed circuits which are prepared by means of vapor phase soldering and thermo-compression bonding place severe thermal stresses on the conductive metal-to-resin bonds of commonly used epoxide resin-base laminate materials. In order to overcome this disadvantage, manufacturers of circuit boards have utilized various resin systems which possess higher glass transition temperatures and higher bond strengths at soldering temperatures, examples of said resin systems including triazine resins, polyimide resins, etc. While overcoming the aforementioned disadvantage of the thermal stress, the solution to one problem has resulted in another disadvantage, namely, that the resin systems so employed are substantially more expensive than the epoxide resins. In addition to the more expensive price, these higher temperature resin systems also exhibit increased chemical resistance as compared to the epoxy resins. A negative point or disadvantage to this increasing chemical resistance relates to more difficult smear removal or etchback of drilled interconnecting holes prior to plating through these holes to form a desired circuit.

As will hereinafter be set forth in greater detail, it has now been discovered that a more inexpensive laminate may be prepared which will not possess the disadvantages hereinbefore set forth in that it may be prepared in a more economical manner while retaining the desirable characteristics necessary for use in electrical and electronic equipment.

SUMMARY OF THE INVENTION

This invention relates to a laminate for use as a printed circuit board. More specifically, the invention relates to a laminate which combines dissimilar resin (reinforced or otherwise) systems, one system acting as a barrier and the other system acting as a core material, a conductive metal being coated on at least one side of the barrier material.

It is therefore an object of this invention to provide a laminate which may be used for a printed circuit board.

Another object of this invention is to provide a laminate which will exhibit desirable properties of temperature resistance and chemical resistance superior in nature to the properties now possessed by conventional laminates.

In one aspect, an embodiment of this invention resides in a laminate for use as a circuit board comprising at least one thin barrier material of a high temperature-resistant resin containing a layer of a conductive metal on one surface thereof, said barrier material being bonded to at least one side of a core material which possesses a temperature resistance lower than that of said barrier material.

Another embodiment of this invention is found in a process for the production of a laminate for use as a circuit board which comprises contacting one side of a sheet of a conductive metal with a high temperature-resistant barrier material, subjecting the resultant composite to an appropriate cure at an elevated temperature and likely elevated pressure, laying-up at least one ply of this cured barrier composite with at least one ply of a cure material which possesses a temperature resistance lower than that which is possessed by said barrier material, said core material likely being in a B-stage form; subjecting the lay-up to a cure at an elevated temperature and pressure, and recovering the final desired laminate.

A specific embodiment of this invention is found in a laminate for use as a circuit board comprising at least one thin barrier material of a polyimide resin having a thickness in the range of from 0.0005 to about 0.004 inch containing a layer of copper on one surface thereof, said barrier material being bonded to at least one side of a core material comprising an epoxy resin which possesses a thickness in the range of from about 0.0005 to about 0.5 inch.

Another specific embodiment of this invention is found in a process for the production of a laminate for use as a circuit board which comprises contacting the treated side of a sheet of copper with a polyimide resin-based pre-preg, subjecting the resultant composite to a cure at a temperature of 350° to 450° F. and a pressure in the range of from about 100 to about 1200 psi for from 1 to 6 hours, possibly post-curing said composite at a temperature in the range of from about 400° to about 450° F. for from 6 to 96 hours or more, laying-up at least one ply of the cured composite with at least one ply of an epoxy resin, said resin being in a B-stage form, subjecting the lay-up to a cure at a temperature in the range of from about 300° to about 350° F. and a pressure in the range of from about 100 to about 1200 psi for from 0.5 to 3 hours, and possibly post-curing the lay-up at a temperature in the range of from about 300° to about 400° F. for a period of time in the range of from about 1 to about 100 hours, and recovering the desired laminate.

Other objects and embodiments will be found in the following further detailed description of the present invention.

DESCRIPTION OF THE INVENTION

As hereinbefore set forth, the present invention is concerned with a laminate which may be used for a printed circuit board substrate and to a process for preparing these laminates. The laminates of the present invention comprise at least one thin barrier of a high temperature-resistant resin having a layer of a conductive metal on one surface thereof, this thin barrier material being bonded to at least one side of a core material which possesses a temperature resistance lower than that of the aforesaid thin barrier material. Examples of thin barrier materials which are bonded to at least one side of the core material comprise polymeric resin systems which possess a high temperature resistance. Examples of polymeric resin systems which may be employed in the barrier material will include thermosetting addition-type polyimides, triazines, bismaleimide triazines, etc. It is also contemplated within the scope of this invention that the barrier material may include glass or fiber reinforcements admixed with or integral with the aforesaid resin system. For example, the barrier material may comprise a glass cloth impregnated with the aforesaid resins or may utilize a fiber such as cloth, including cotton, denim, etc. or a paper or wood-type fiber which is also impregnated with the polymeric resin system prior to being employed as the barrier material.

The thin barrier material will contain, on one surface thereof, a layer of a conductive metal which may be in the form of sheets or foil, examples of such conductive metal including copper, nickel, aluminum, gold, silver, etc. The barrier material containing the layer of conductive metal on one surface thereof, which is prepared in a manner hereinafter set forth in greater detail, will be bonded to at least one side of a core material which possesses a temperature resistance lower than that of the barrier material. The core material may be formed of such materials as an epoxy/woven-glass laminate, an epoxy/woven-glass mat laminate, a phenolic resin/paper laminate, a phenolic resin/fiberglass reinforced laminate, a polysulfone, polyolefin or other thermoplastic or thermosetting resins, etc. It is to be understood that the aforementioned polymeric resin systems which may be used as barrier materials or the laminates which may be used as the core materials are only representative of the class of materials which may be employed and that the present invention is not necessarily limited thereto.

The laminates for the printed circuit boards may be prepared in various ways. For example, when the barrier material comprises only a polymeric resin system, the conductive metal may be dipped, sprayed or painted with the pure resin, a sufficient amount of resin being employed to provide the desired thickness of the barrier layer on the conductive metal, said thickness being in a range of from about 0.0005 to about 0.004 inches. Following this, the barrier material which contains the conductive metal on one surface thereof is then subjected to a cure whereby the barrier material is fully cured. Alternatively, when the barrier material comprises a class cloth or fiber impregnated with the resin system, the cloth is then laminated to one side of the conductive metal. Thereafter, the composite is then subjected to a full cure. The full cure of the barrier material containing the conductive metal on one surface thereof is effected at elevated temperatures and pressures, said temperatures being in a range of from about 150° to about 450° F., while employing pressures which may range from about 100 to about 1200 pounds per square inch (psi) for from about 0.5 to about 6 hours. Thereafter, the composite may be subjected to a post-cure which is effected at a temperature in the range of from about 250° to about 450° F. for a period of time which may range from about 1 to about 96 hours or longer, depending on the temperature used.

The desired laminate which may be used as a circuit board is then prepared by laying-up the barrier material containing the conductive metal on one surface thereof with at least one ply of a core material of the type hereinbefore set forth in greater detail, said core material possessing a temperature resistance lower than that of the barrier material. It is contemplated within the scope of this invention that the core material may comprise more than one layer, for example, two to about 200 layers of core material may be employed, the number of plies being dependent upon the desired thickness of the core material and the thickness per ply, said thickness generally ranging from about 0.005 to about 0.5 inch. It is further contemplated within the scope of this invention that the barrier material may be prepared on one or both of the outer sides of the core material. After laying up the high temperature barrier ply to the core, the lay-up is then fully cured by subjecting the laminate to a temperature in the range of from about 150° to about 450° F. and a pressure in the range of from about 100 to about 1200 psi for a period of time which is in the range of from about 0.5 to about 6 hours. Following this, if so desired, the laminate may then be post-cured at a temperature in the range of from about 150° to about 450° F. for from 1 to about 96 hours or longer if necessary to form the fully cured final lamination.

The final laminate of the present invention which is prepared in the manner hereinbefore set forth will evidence increased thermal resistance to various high temperature electronic surface mounting techniques, principally in the field of thermo-compression and vapor-phase solder reflow as compared to a laminate composed of only the core material. The composite laminate of the present invention will be more readily subjected to the techniques which are employed by the printed wiring fabricators and/or users as compared to a laminate composed entirely of the high temperature-resistant barrier material, when machining the printed wiring board when employing such steps as drilling, routing, punching, etc, plating (either additive- or electroplating), and in the smear removal or etchback of drilled or punched holes. In addition, as hereinbefore mentioned, the composite laminate of the present invention will be more inexpensive to fabricate than would be a homogeneous laminate consisting only of the high temperature-resistant resin and a glass reinforcing matrix. This is due to the fact that the barrier layer of the composite laminate, which is relatively thin, requires only a small amount of the high temperature, high expense resin as opposed to the same thickness laminate which comprises only the high temperature resin system.

The following examples are given to illustrate these novel laminates which may be used for printed circuit boards, and to a method for preparing the same. However, it is to be understood that these examples are given merely for purposes of illustration and that the present invention is not necessarily limited thereto.

EXAMPLE I

A laminate for use as a circuit board was prepared by bonding one ply of a pre-preg material comprising a glass mat which had been impregnated with a polyimide resin and subjected to a B-stage cure. The pre-preg material which was 0.004 inch in thickness was bonded to a one ounce copper foil in a lamination process which comprised subjecting the impregnated glass mat and the copper foil to a temperature up to 350° F. in a press for a period of 120 minutes under a pressure of 800 psi. The resulting composite, in which the copper foil was only on one side of the impregnated glass mat, was post-cured at a temperature of about 425° F. for a period of 24 hours.

The desired laminate was then prepared by laying up 7 plies of a glass/epoxy material in pre-preg form having an "as-pressed" thickness of 0.020 inch as a core in a sandwich form between one ply of the copper-clad barrier material prepared according to the above paragraph, the copper cladding being on the outside of such layer of the barrier material. The lay-up was then cured at a temperature of 350° F. for a period of 80 minutes under an implied pressure of 500 psi. The fully cured laminate, which comprised two outside layers of copper bonded to two layers of the high temperature-resistant barrier material with a core of glass epoxy resin, was then recovered.

EXAMPLE II

In a manner similar to that set forth in Example I above, a laminate for use in a printed circuit board may be prepared by coating one side of a one ounce copper foil with a triazine resin, the amount of resin being applied to the copper foil being sufficient to provide a thin barrier layer having a thickness of about 0.001 inch. The triazine-coated foil may then be subjected to a heat treatment of about 350° F. for a period of 50 minutes followed by a post-cure of about 400° F. for 8 hours to fully cure the triazine resin. Thereafter, a sufficient number of plies of a phenolic resin-fiber-glass laminate to provide a core having a thickness of 0.005 inch may be laid up with one ply of the barrier material on each side of the core. This laminate may then be cured at a temperature of about 290° F. for a period of 45 minutes under a pressure of 1000 psi to provide the desired laminate.

EXAMPLE III

In this example, a high temperature barrier material may be prepared by bonding a one ounce nickel foil to a glass mat which may be impregnated with a bis-maleimide-triazine resin and which may be subjected to a B-stage cure prior to lamination with the nickel. The nickel foil which is used to clad the mat may be roughened on one side thereof, the roughed side being in contact with the resin-impregnated glass mat. The thus formed barrier material may then be cured at a temperature of 350° F. and a pressure of 900 psi for a period of 60 minutes. The resulting composite may then be post-cured at a temperature of 375° F. for about 4 hours following which one side of the composite may have the nickel cladding removed by etching to leave the exposed surface of the barrier material in a roughened state which may replicate the roughened surface of the nickel foil.

The desired laminate may then be prepared by laying up a core comprised of a sufficient number of plies of an epoxy-woven glass laminate to provide a thickness of 0.01 inch with one ply on each side of the core of the thin barrier material which may be prepared according to the above paragraph. The resulting lay-up may then be cured at a temperature of 350° F. for a period of 60 minutes at a pressure of 1000 psi to provide a laminate which may thereafter be used in printed circuit boards.

I claim as my invention:

1. A laminate for use as a circuit board comprising at least one barrier material having a thickness in the range of from about 0.0005 to about 0.004 inches consisting essentially of a high temperature resistant resin selected from the group consisting of a resin based on a polyimide resin, a triazine resin, a bis-maleimide triazine resin and an epoxy resin containing a layer of a conductive metal on one surface thereof, wherein said metal is selected from the group consisting of copper, aluminum, gold and silver, and wherein said barrier material is bonded to at least one side of a core material possessing a thickness in the range of from about 0.005 to about 0.5 inches and possessing a temperature resistance that is lower than that of said barrier material and which is selected from the group consisting of a phenolic resin, an epoxy resin, an epoxy-woven glass laminate and a phenolic resin-glass laminate.

* * * * *